(12) United States Patent
Imai et al.

(10) Patent No.: US 8,168,899 B2
(45) Date of Patent: May 1, 2012

(54) ENGINE STARTER SWITCH DEVICE

(75) Inventors: Toshiaki Imai, Aichi (JP); Koji Suzuki, Aichi (JP)

(73) Assignee: Kabushiki Kaisha Tokai Rika Denki Seisakusho, Aichi (JP)

( * ) Notice: Subject to any disclaimer, the term of this patent is extended or adjusted under 35 U.S.C. 154(b) by 333 days.

(21) Appl. No.: 12/550,824

(22) Filed: Aug. 31, 2009

(65) Prior Publication Data

US 2010/0051425 A1    Mar. 4, 2010

(30) Foreign Application Priority Data

Sep. 1, 2008    (JP) ................ P2008-223420

(51) Int. Cl.
*H01H 27/06* (2006.01)
(52) U.S. Cl. .................................. 200/43.03
(58) Field of Classification Search .......... 200/43.01, 200/293, 400, 16 R, 504, 51.04, 341, 43.08, 200/202, 61.27, 61.54
See application file for complete search history.

(56) References Cited

U.S. PATENT DOCUMENTS 5,132,653 A * 7/1992 Nakatake et al. ............. 335/202
7,569,787 B2 * 8/2009 Kurasawa et al. ............ 200/400

FOREIGN PATENT DOCUMENTS

JP    2006-273025    10/2006

* cited by examiner

*Primary Examiner* — Edwin A. Leon
(74) *Attorney, Agent, or Firm* — Morgan, Lewis & Bockius LLP

(57) ABSTRACT

A coil bobbin to which an immobilizer coil is mounted, coil connecting terminals to which ends of the coil are connected, a fixed contact, a terminal for the fixed contact and connector terminals are integrally formed by resin molding into a coil bobbin integrated type insulator. Then, the coil connecting terminals, the terminal for the fixed contact, and the connector terminals are respectively soldered to a wiring board. All of them are incorporated in a body. In this manner, stress exerted on the soldered areas between the coil connecting terminals and the wiring board can be moderated to the substantially same extent as stress exerted on the soldered areas between the terminal for the fixed contact and the connector terminals, and the wiring board.

3 Claims, 8 Drawing Sheets

PRIOR ART

PRIOR ART

ENGINE STARTER SWITCH DEVICE

BACKGROUND OF THE INVENTION

The present invention relates to an engine starter switch device provided with an immobilizer coil.

In recent years, an immobilizer system has been developed in a vehicle such as an automobile, for the purpose of preventing theft. The immobilizer system has such a structure that a transponder is provided in a portable key or a portable device, while an immobilizer coil for two-way transmission is provided in an engine starter switch device of the vehicle, and an ID code of the transponder side and an ID code of the vehicle side are compared, so that an engine is allowed to start only when collation of them has been established.

FIGS. 6 to 10 show an example of a conventional engine starter switch device of this type. In FIGS. 8 to 10, a coil bobbin 2 in an annular shape is assembled to a front part of a body 1. An immobilizer coil 3 (See FIG. 9) is mounted to the coil bobbin 2, and coil connecting terminals 4 for connecting a starting end and a terminal end of the immobilizer coil 3 are also provided on the coil bobbin 2 by insert molding. An insulator 5 is assembled to the body 1 at a position behind the coil bobbin 2. A fixed contact 6 (See FIG. 9), terminals 7 for electronic components, and terminals 8 for connectors are provided on the insulator 5 by insert molding. Moreover, the insulator 5 is equipped with an LED 9a for an indicator and an LED 9b for night illumination, both of which are the electronic components. These LEDs 9a, 9b are connected to the aforesaid terminals 7 for the electronic components. Further, a wiring board 10 formed of a printed board is disposed inside the body 1. The wiring board 10 is provided with coil connecting terminal connecting parts 10a, electronic component terminal connecting parts 10b, and connector terminal connecting parts 10c in a shape of through hole.

The aforesaid coil connecting terminals 4 are inserted into the coil connecting terminal connecting parts 10a, and fixed by soldering, the aforesaid terminals 7 for the electronic components are inserted into the electronic component terminal connecting parts 10b and fixed by soldering, and the aforesaid terminals 8 for the connectors are inserted into the connector terminal connecting parts 10c and fixed by soldering.

A bezel 11 in a ring-like shape is attached to a front part of the body 1, and an operating knob 12 of a push-button type for an engine starter switch is arranged inside this bezel 11. Moreover, a holder 13 is disposed inside the body 1, and connected to the operating knob 12. Both the operating knob 12 and the holder 13 can move along an axial direction of the body 1. These operating knob 12 and holder 13 are urged forward by a return spring 14 (See FIG. 8). Movable contacts 15 are provided on the holder 13, in such a manner that the movable contacts 15 may be contacted with and separated from the aforesaid fixed contact 6, following the movement of the holder 13. The engine starter switch 16 (See FIG. 9) is composed of the movable contacts 15 and the fixed contact 6. Therefore, the engine starter switch 16 is so constructed as to be actuated by pushing operation of the operating knob 12.

Further, the operating knob 12 is provided with an opening 12a for the indicator. A lens 17 having an indicator part 17a in a front part thereof is provided behind this opening 12a. This lens 17 guides a light of the aforesaid LED 9a to the indicator part 17a to light it up. Moreover, a detent spring 18a and a ball 18b are provided between the holder 13 and the insulator 5. A cover 19 is mounted on an outer periphery of the body 1 so as to cover a side opening 1a of the body 1. In FIG. 8, reference numeral 20 represents cushions for absorbing sound of a shock when the holder 13 moves.

In the conventional structure as described above, there is a problem as follows. The coil connecting terminals 4 of the coil bobbin 2, and the electronic component terminals 7 and the connector terminals 8 of the insulator 5 are respectively soldered to the same wiring board 10. However, the coil bobbin 2 and the insulator 5 are separate members, and respectively assembled to the body 1. For this reason, particularly, those areas where the coil connecting terminals 4 are soldered to the wiring board 10 are influenced by thermal expansion and shrinkage of the insulator 5, the body 1 and the coil bobbin 2, due to a change of environmental temperature (a thermal impact) of the vehicle. Consequently, the soldered areas of the coil connecting terminals 4 are subjected to a larger stress than the areas where the electronic component terminals 7 and the connector terminals 8 on the aforesaid insulator 5 are soldered to the wiring board 10. There is such anxiety that a crack may occur in the soldered areas, when the aforesaid thermal impact is repeated, and faulty electrical continuity may occur.

Although not directly concerned with the problem of the invention, a structure of an engine starter switch provided with an immobilizer coil is disclosed in Japanese Patent Publication No. JP-A-2006-273025.

The invention has been made in view of the above described circumstances, and an object of the invention is to provide an engine starter switch device in which a stress exerted on soldered areas between coil connecting terminals to which ends of the immobilizer coil are connected and a wiring board can be moderated to the substantially same extent as a stress exerted on soldered areas between terminals at an insulator side and the wiring board, whereby occurrence of faulty electrical continuity in the soldered areas between the coil connecting terminals and the wiring board can be prevented.

SUMMARY OF THE INVENTION

In order to attain the above described object, there is provided, according to the invention, an engine starter switch characterized by comprising a body, a coil bobbin integrated type insulator including a coil bobbin to which an immobilizer coil is mounted, coil connecting terminals to which ends of the immobilizer coil are connected, a fixed contact, and connector terminals which are integrally formed by resin molding, the coil bobbin integrated type insulator being assembled to the body, a wiring board including coil connecting terminal connecting parts to which the coil connecting terminals are soldered, and connector terminal connecting parts to which the connector terminals are soldered, an operating member which is operatively provided on the body, and a movable contact which is provided so as to be contacted with and separated from the fixed contact, according to operation of the operating member, and constitutes an engine starter switch in cooperation with the fixed contact.

In this invention, the coil connecting terminals to which the ends of the immobilizer coil are connected, and the connector terminals are provided on the coil bobbin integrated type insulator which is the same component, and respectively soldered to the wiring board which is the same component. Therefore, it is only one component of the coil bobbin integrated type insulator that is influenced by the thermal expansion and shrinkage due to a change of the environmental temperature (a thermal impact). Consequently, the areas where the coil connecting terminals are soldered to the wiring board are under the substantially same condition as the areas where the connector terminals are soldered to the wiring board. As the results, the stress exerted on the soldered areas between the coil connecting terminals and the wiring board can be moderated to the substantially same extent as the stress exerted on the soldered areas between the connector terminals and the wiring board, whereby occurrence of faulty electrical continuity in the soldered areas between the coil connecting terminals and the wiring board can be prevented.

DETAILED DESCRIPTION OF PREFERRED EMBODIMENTS

Figure 1:
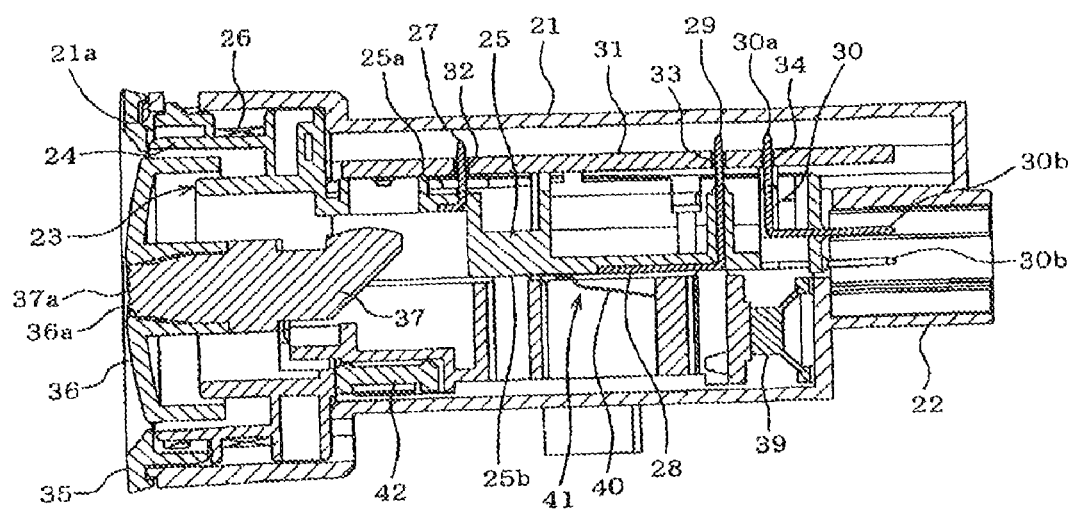
FIG. 1 is a sectional view showing an engine starter switch device in an embodiment according to the invention, taken along a line X1-X1 in FIG. 3.
Figure 2:
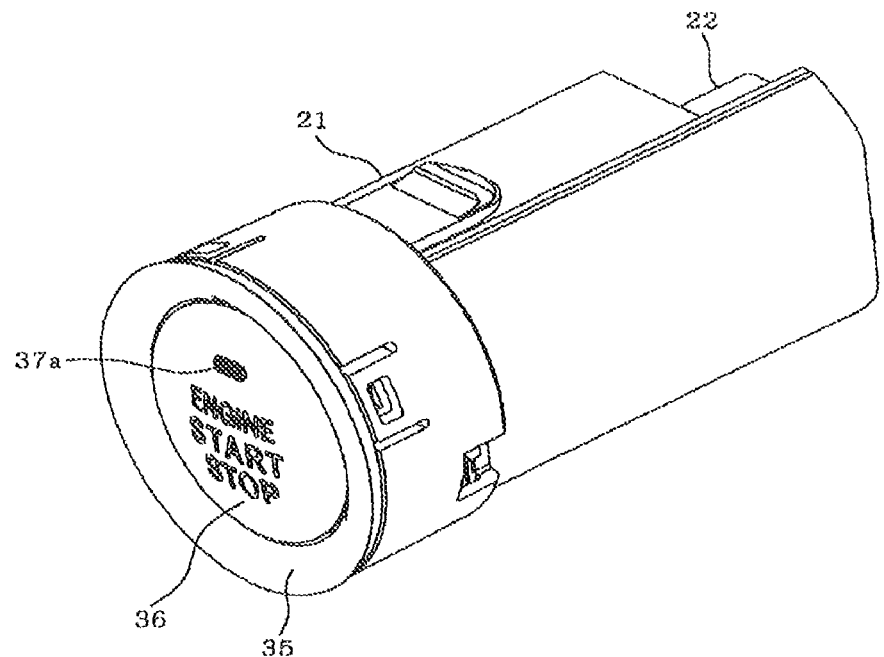
FIG. 2 is a perspective view showing an outer appearance of an entirety of the device.
Figure 3:
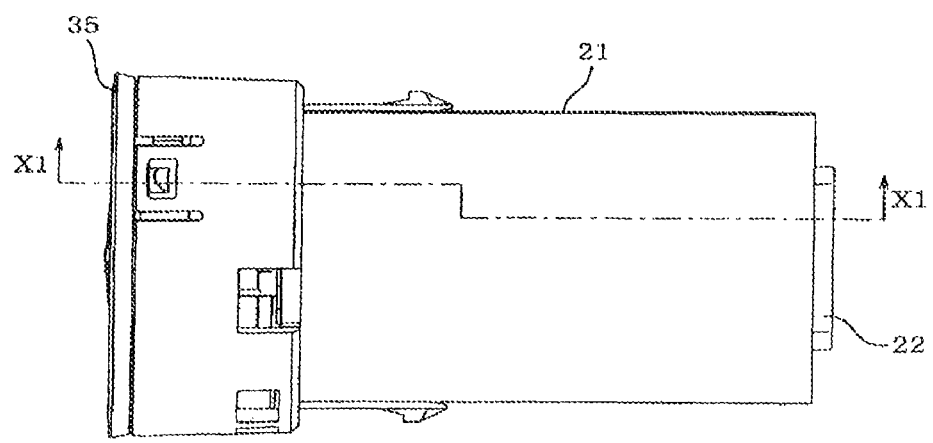
FIG. 3 is a right side view of the device.
Figure 4:
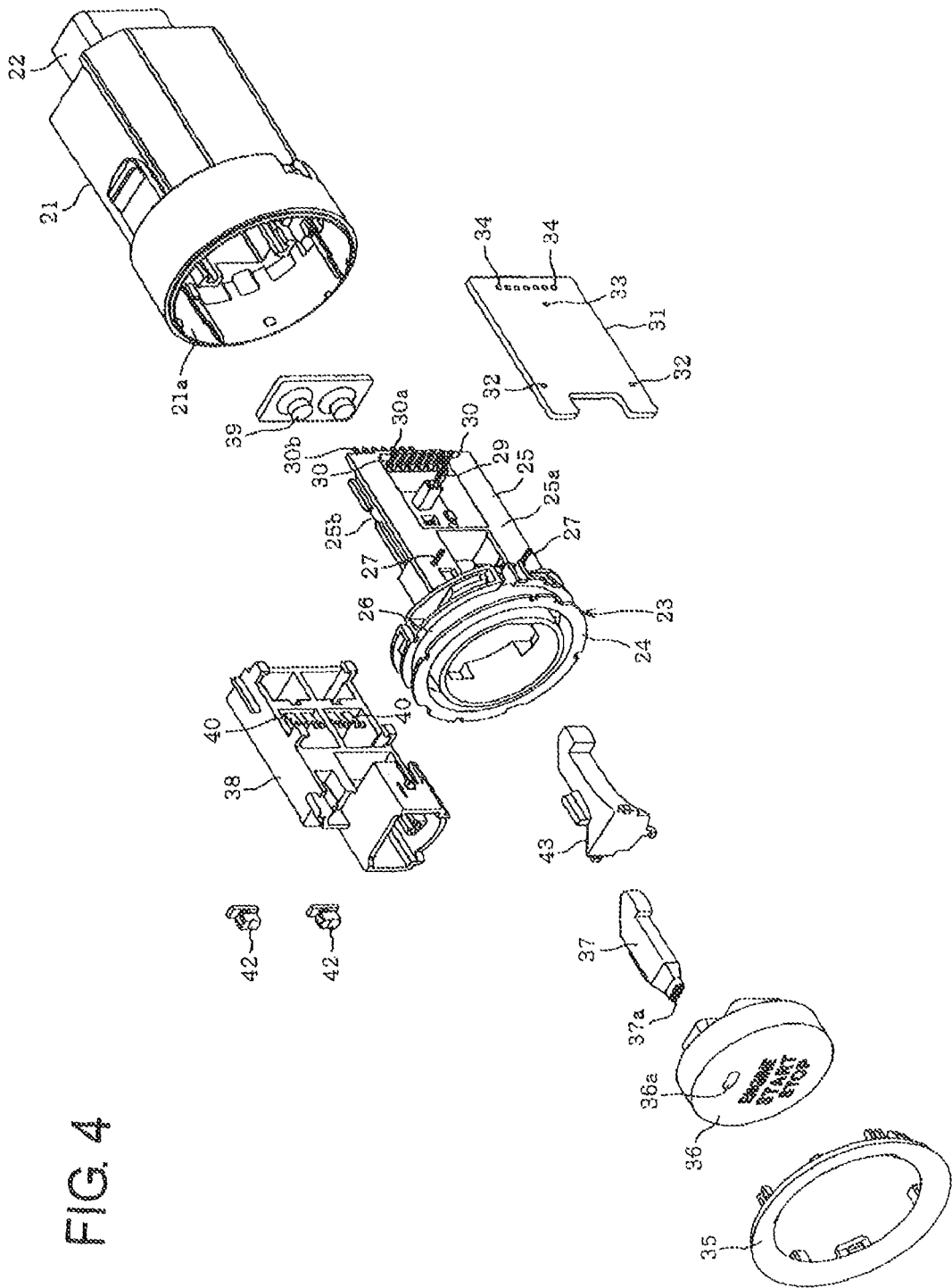
FIG. 4 is an exploded perspective view of the entirety of the device.
Figure 5:
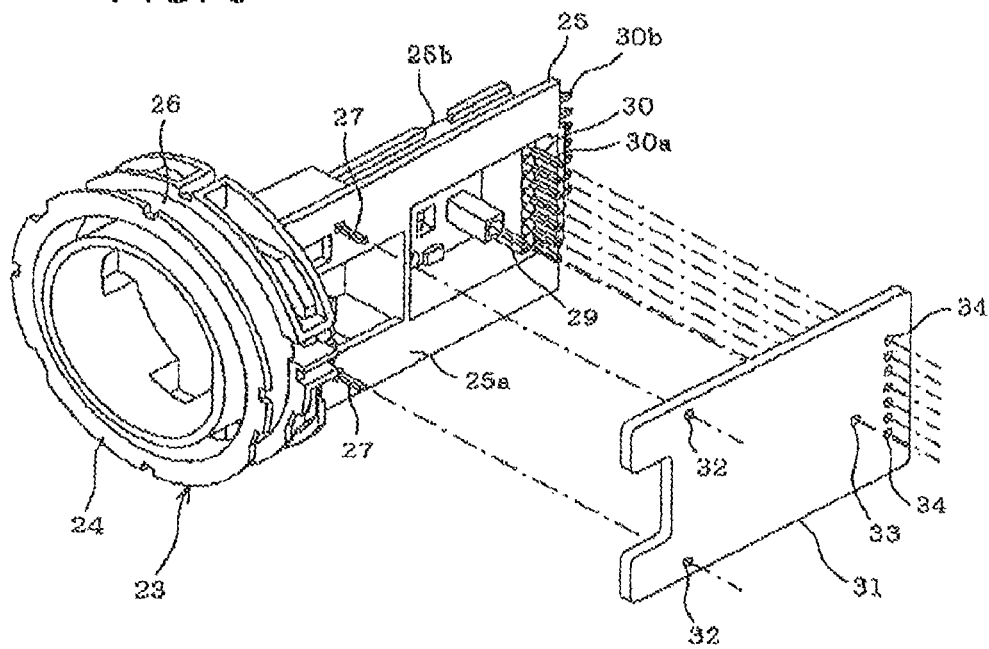
FIG. 5 is an exploded perspective view of an essential part of the device.
Figure 6:
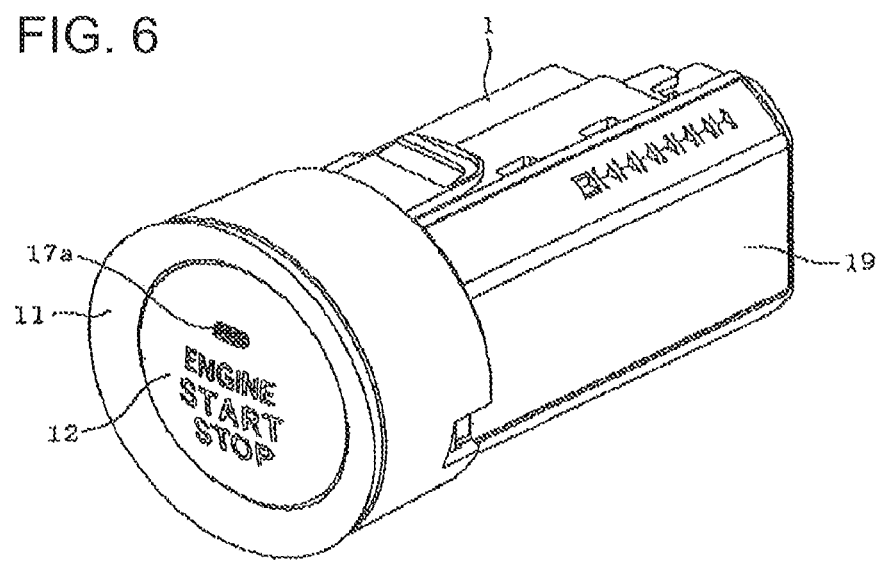
FIG. 6 is a view corresponding to FIG. 2, showing a conventional device.
Figure 7:
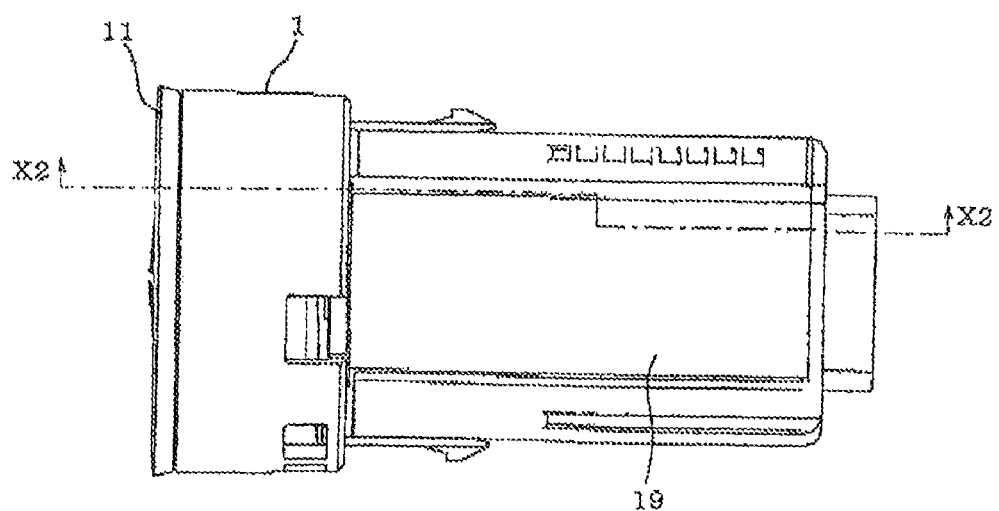
FIG. 7 is a view corresponding to FIG. 3.
Figure 8:
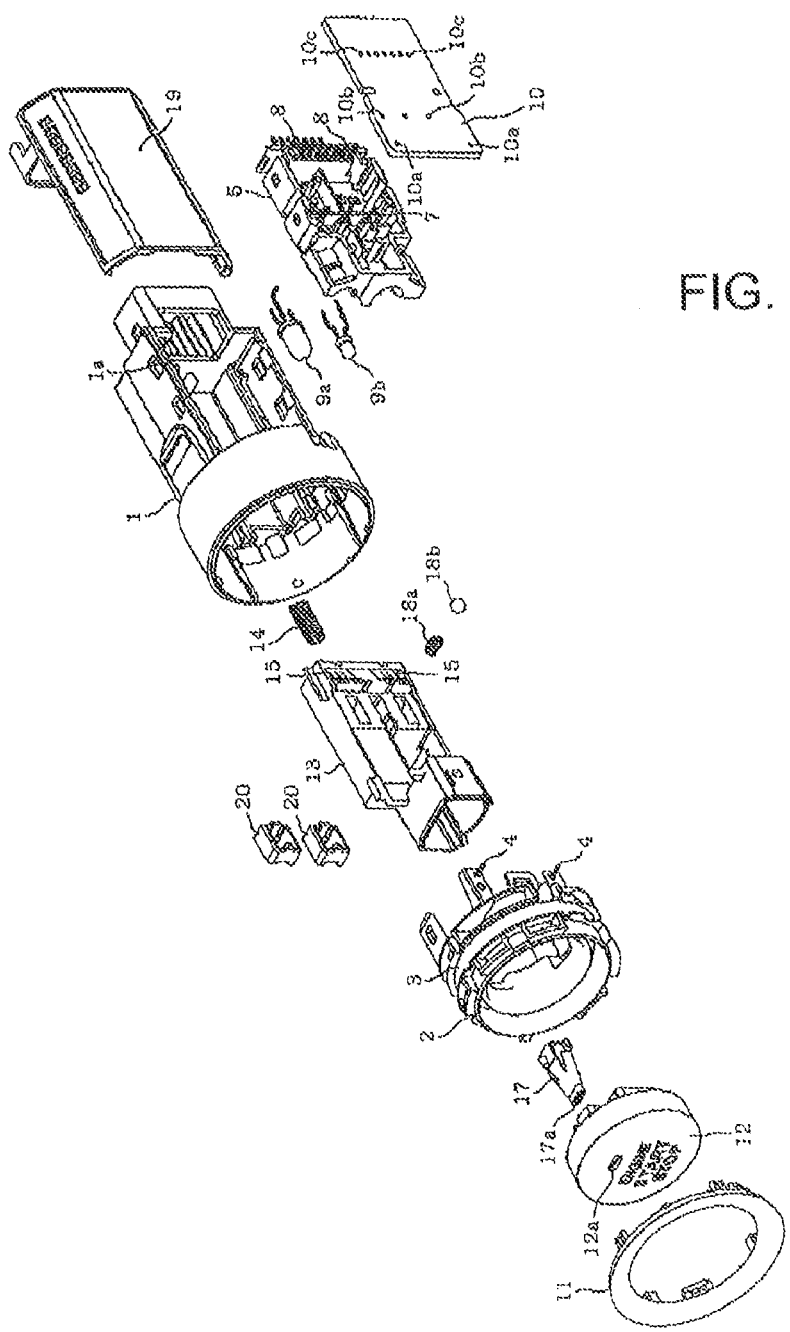
FIG. 8 is an exploded perspective view of an entirety of the conventional device.
Figure 9:
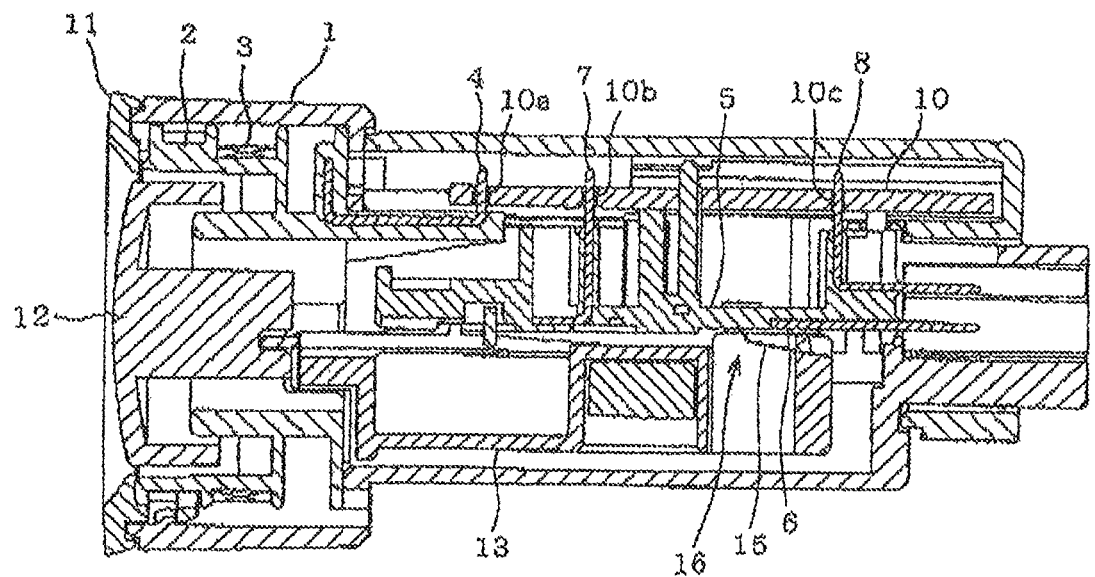
FIG. 9 is a sectional view taken along a line X2-X2 in FIG. 7.
Figure 10:
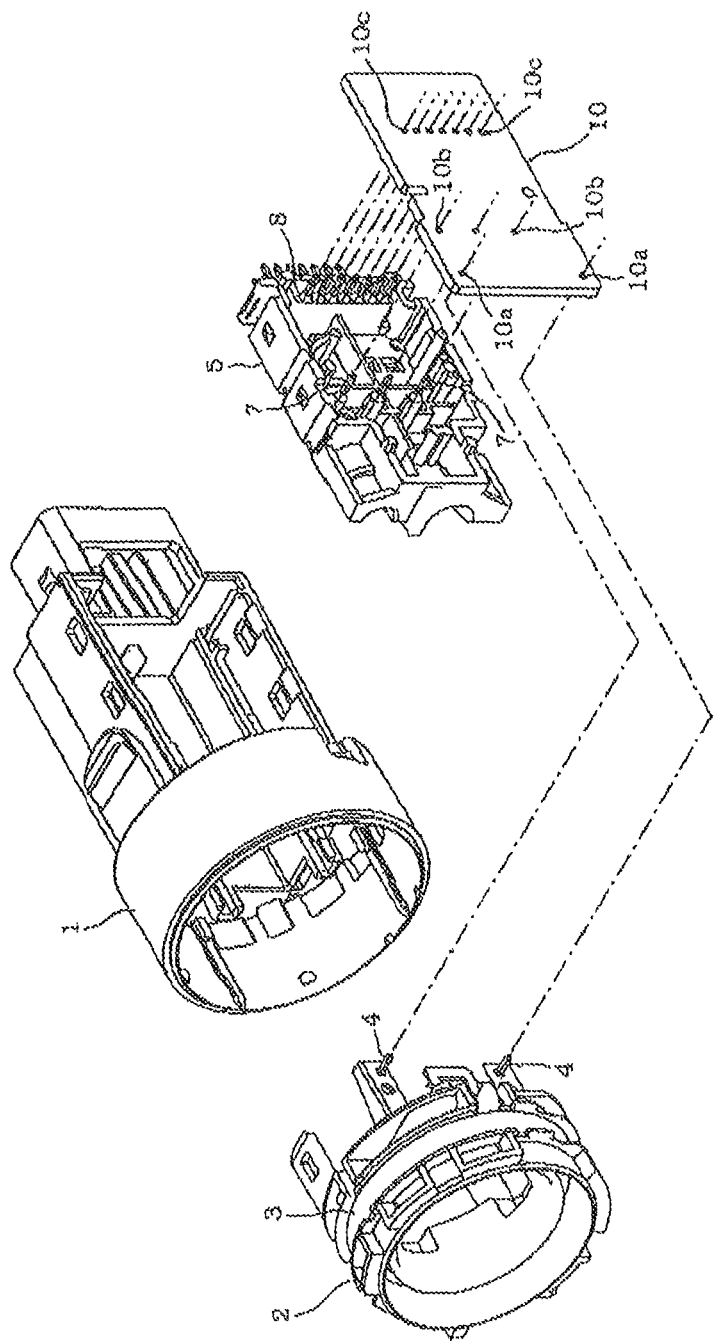
FIG. 10 is an exploded perspective view of an essential part of the conventional device.

Now, an embodiment of the invention will be described referring to FIGS. 1 to 5. As shown in FIGS. 1 and 4, a body 21 has an opening 21a in a round shape on its front face, and a case part 22 for connectors integrally formed in its back part. A coil bobbin integrated type insulator 23 is incorporated in the body 21.

This coil bobbin integrated type insulator 23 integrally has a coil bobbin 24 in an annular shape which is provided in its front part, and an insulator part 25 which is provided so as to extend backwardly from this coil bobbin 24. The coil bobbin 24 is arranged in the front part of the body 21. An immobilizer coil 26 (See FIG. 1) is mounted to the coil bobbin 24.

Two coil connecting terminals 27 are provided in the front part of the insulator part 25 so as to extend laterally from one of side faces 25a of the insulator part 25. Although not shown in the drawings, a starting end and a terminal end of the immobilizer coil 26 are electrically connected to these coil connecting terminals 27. A fixed contact 28 (See FIG. 1) is provided on the other side face 25b of the insulator part 25, at an opposite side to the aforesaid one side face 25a. A terminal 29 for the fixed contact is provided on the one side face 25a of the insulator part 25 at a substantially middle position in a longitudinal direction, so as to extend laterally from the one side face 25a. The terminal 29 for the fixed contact is formed of the same material as the fixed contact 28. Moreover, a plurality of connector terminals 30 are provided at a backward side of the insulator part 25. Each of the connector terminals 30 has one end portion 30a which is projected laterally from the one side face 25a, and the other end portion 30b which is positioned in the aforesaid case part 22 for the connectors so as to project backward.

In this embodiment, the aforesaid coil bobbin integrated type insulator 23 is so constructed that the coil bobbin 24, the insulator part 25, the coil connecting terminals 27, the fixed contact 28, the terminal 29 for the fixed contact, and the connector terminals 30 are integrally formed by resin molding.

A wiring board 31 formed of a printed board is disposed in the body 21, at a position opposed to the one side face 25a of the insulator part 25. This wiring board 31 is provided with connecting parts 32 for the coil connecting terminals in a form of through hole in its forward part, and further, connecting parts 33 for the terminals for the fixed contact and connecting parts 34 for the connector terminals are provided in its backward part. The aforesaid coil connecting terminals 27 are inserted into the coil connecting terminal connecting parts 32 to be connected by soldering. The terminal 29 for the fixed contact is inserted into the fixed contact terminal connecting part 33 to be connected by soldering. One end portions 30a of the connector terminals 30 are inserted into the connector terminal connecting parts 34 to be connected by soldering. Although not shown in the drawings, the wiring board 31 is equipped with LEDs for an indicator and for night illumination.

In this case, after the coil connecting terminals 27, the terminal 29 for the fixed contact, and the connector terminals 30 in the coil bobbin integrated type insulator 23 have been respectively soldered to the wiring board 31, they are incorporated into the body 21.

A ring-shaped bezel 35 is attached to the front part of the aforesaid body 21, and an operating knob 36 of a push button type for the engine starter switch (corresponding to an operating member in the invention) is disposed inside the bezel 35. The operating knob 36 is provided with an opening 36a for an indicator, and a lens 37 having an indicator part 37a in its front part is mounted to this opening 37a. This lens 37 guides a light of the aforesaid LED for the indicator (not shown) to the indicator part 37a to light it up. Moreover, a holder 38 is disposed in the body 21. This holder 38 is connected to the operating knob 36 in such a manner that the operating knob 36 and the holder 38 can move along an axial direction of the body 21.

These operating knob 36 and holder 38 are urged forward by a rubber spring 39 which is disposed inside the body 21. This rubber spring 39 functions as urging means for urging the operating knob 36 and the holder 38 forward, and also as detent means. The holder 38 is provided with movable contacts 40, and the movable contacts 40 are adapted to be contacted with and separated from the aforesaid fixed contact 28 along with the movement of the holder 38. The movable contacts 40 and the fixed contact 28 constitute an engine starter switch 41 (See FIG. 1). Therefore, the engine starter switch 41 is so constructed as to be actuated by pushing operation of the operating knob 36. In FIG. 4, reference numeral 42 represents cushions for absorbing sound of a shock when the holder 38 moves. Moreover, reference numeral 43 represents a light guide for guiding the light of the LED for illumination (not shown) to light up the operating knob 36 from backside. In this manner, the engine starter switch device is constructed. The connector terminals 30 in this engine starter switch device are electrically connected to a vehicle body side.

According to the above described structure, the following operational effects can be obtained. The coil connecting terminals 27 to which the ends of the immobilizer coil 26 are connected, the terminal 29 for the fixed contact, and the connector terminals 30 are provided on the coil bobbin integrated type insulator 23 which is the same component, and at the same time, they are respectively soldered to the coil connecting terminal connecting parts 32, the fixed contact terminal connecting part 33, and the connector terminal connecting parts on the wiring board 31 which is the same component. For this reason, it is only one component of the coil bobbin integrated type insulator 23 that is influenced by thermal expansion and shrinkage due to a change of the environmental temperature (thermal impact), and the soldered areas between the coil connecting terminals 27 and the wiring board 31 become under the substantially same condition as the soldered areas between the terminal 29 for the fixed contact and the connector terminals 30, and the wiring board 31. Accordingly, the stress exerted on the soldered areas between the coil connecting terminals 27 and the wiring board 31 can be moderated to the substantially same extent as the stress exerted on the soldered areas between the terminal 29 for the fixed contact and the connector terminals 30, and the wiring board 31, and hence, occurrence of faulty electrical continuity in the soldered areas between the coil connecting terminals 27 and the wiring board can be prevented.

Terms in the Drawings:

| FIG. 1, | |
|---|---|
| 21 | BODY |
| 23 | COIL BOBBIN INTEGRATED TYPE INSULATOR |
| 24 | COIL BOBBIN |
| 26 | IMMOBILIZER COIL |
| 27 | COIL CONNECTING TERMINAL |
| 28 | FIXED CONTACT |
| 30 | CONNECTOR TERMINAL |
| 31 | WIRING BOARD |
| 32 | COIL CONNECTING TERMINAL CONNECTING PART |
| 34 | CONNECTOR TERMINAL CONNECTING PART |
| 36 | OPERATING MEMBER |
| 40 | MOVABLE CONTACT |
| 41 | ENGINE STARTER SWITCH |

What is claimed is:

1. An engine starter switch device comprising:
    a body;
    a coil bobbin integrated type insulator being made of resin and assembled to the body, wherein a coil bobbin to which an immobilizer coil is mounted, a coil connecting terminal to which an end of the immobilizer coil is connected, a fixed contact, and a connector terminal are embedded in the insulator;
    a wiring board including a connecting part to which the coil connecting terminal is soldered, and a connecting part to which the connector terminal is soldered;
    an operating member which is operatively provided on the body; and
    a movable contact which is provided so as to be contacted with and separated from the fixed contact according to operation of the operating member, and forms an engine starter switch in cooperation with the fixed contact.

2. The engine starter switch device according to claim 1, wherein
    the insulator includes an insulator part which is provided so as to extend backwardly from the coil bobbin,
    the coil connecting terminal and the connector terminal are provided to extend laterally from one of side faces of the insulator part, and
    the fixed contact is provided on the other face of the insulator part.

3. The engine starter switch device according to claim 2, wherein the movable contact is provided on a holder which is connected to the operating member and is movable along an axial direction of the body, in such a manner that the movable contact is contacted with and separated from the fixed contact according to operation of the operating member.

* * * * *